United States Patent [19]
Li

[11] Patent Number: 5,082,793
[45] Date of Patent: Jan. 21, 1992

[54] METHOD FOR MAKING SOLID STATE DEVICE UTILIZING ION IMPLANTATION TECHNIQUES

[76] Inventor: Chou H. Li, 379 Elm Dr., Roslyn, N.Y. 11576

[21] Appl. No.: 438,692

[22] Filed: Nov. 17, 1989

Related U.S. Application Data

[63] Continuation of Ser. No. 386,102, Aug. 6, 1973, Pat. No. 4,946,800, which is a continuation-in-part of Ser. No. 154,300, Jun. 18, 1971, abandoned, which is a continuation-in-part of Ser. No. 761,646, Sep. 23, 1968, Pat. No. 3,585,714, which is a continuation-in-part of Ser. No. 490,955, Sep. 28, 1965, Pat. No. 3,430,109.

[51] Int. Cl.⁵ .................. H01L 21/265; H01L 21/20
[52] U.S. Cl. .................. 437/24; 148/DIG. 76; 148/DIG. 83; 148/DIG. 85; 148/DIG. 117; 357/49; 357/50; 357/91; 437/26; 437/63; 437/64; 437/69

[58] Field of Search .......... 437/24, 26, 64, 63, 437/69; 148/DIG. 85, DIG. 117, DIG. 76, DIG. 83; 357/49, 50, 91

[56] References Cited

U.S. PATENT DOCUMENTS

| | | | |
|---|---|---|---|
| 3,534,234 | 10/1970 | Clevenger | 437/64 |
| 3,586,542 | 6/1971 | MacRae | 437/24 |
| 3,622,382 | 11/1971 | Brack | 437/24 |
| 3,648,125 | 3/1972 | Peltzer | 437/69 X |
| 3,649,386 | 3/1972 | Murphy | 437/69 X |

*Primary Examiner*—William G. Saba
*Attorney, Agent, or Firm*—Cooper & Dunham

[57] ABSTRACT

A method of making a dielectric isolation integrated circuit structure in which dielectric material grooves formed by ion implantation extend down into the structure and intersect a PN junction or other active region at intersection lines such that each intersection line is within microns both laterally from the center of the groove and vertically from the bottom of the groove and the grooves continuously curve at least at the intersection lines at a radius of curvature less than 1 cm.

4 Claims, 1 Drawing Sheet

METHOD FOR MAKING SOLID STATE DEVICE UTILIZING ION IMPLANTATION TECHNIQUES

CROSS-REFERENCE TO RELATED APPLICATIONS

This is a continuation of pending prior application Ser. No. 386,102 filed Aug. 6, 1973, now U.S. Pat. No. 4,946,800 which in turn is a continuation-in-part of application Ser. No. 154,300 filed June 18, 1971 (now abandoned), which in turn is a continuation-in-part of application Ser. No. 761,646 filed Sept. 23, 1968 (now U.S. Pat. No. 3,585,714), which in turn is a continuation-in-part of application Ser. No. 490,955 filed Sept. 28, 1965 (now U.S. Pat. No. 3,430,109.

BACKGROUND OF THE INVENTION

This invention relates in general to miniaturized solid-state devices for signal translation and, more particularly, to surface-passivated, semiconductor devices such as silicon integrated circuitries having the peripheral surfaces of their active regions uniquely buried into and protected by inert material regions.

Solid-state devices in general and semiconductor devices in particular must have exacting surface properties for successful operations. These devices therefore often fail by surface failure mechanisms. The surface of a pn, $p^+n$, $p^-n$, $pn^+$, $pn^-$, p i, n i, metal-oxide, metal-semiconductor, oxide-semiconductor, interfacial rectifying barrier region, or other optoelectromagnetically active signal-translating region (including several coacting, closely spaced rectifying barriers) is especially sensitive to the ambient or contacting material, contaminants, impurities, or submicron floating or rubbing dust particles. While not limited thereto, the invention is herein mostly described as examples applied to semiconductor devices each having a pn junction as its optoelectromagnetically active region.

My U.S. Pat. No. 3,585,714 describes new methods for simultaneously achieving device isolation, junction surface passivation, novel differential expansion of the junction region peripheral surface in integrated circuits, exposure of material hidden underneath the junction, high-density integrated circuits with round-bottomed, intersecting and isolating grooves, and/or greatly expanded peripheral surface for optoelectrical communication or for the otherwise difficult or impossible yet large (relative to the junction width) electrical contacts. Many advantages are thus obtained including: increased yield; decreased cost; improved junction region surface passivation; complete device isolation; increased packing density in integrated circuits; increased switching speed; reduced noise, instability, leakage current, and electrical shorts; improved breakdown voltage or other device characteristics; controlled carriers generation, movement, and recombination at or near the junction region peripheral surface; and regulated optoelectromagnetic interaction of the active region with the ambient or contacting material.

The same issued U.S. patent describes fully the techniques of selective material removal by mechanical, chemical, or particles bombarding means to achieve differentially expanded junction region peripheral surface particularly in integrated microcircuits. Such a surface is resistant to mobile ions, floating particles, and even rubbing contaminants and, hence, greatly reduces surface failures of the device. However, such a surface, being bare, is still not perfectly passivated. Surface layers of inert materials may, therefore, be applied or added onto the differentially expanded peripheral surface for added protection.

Unfortunately, these surface layers are far from being perfect or even inert, but are often full of pinholes, microcracks, and other defects. In addition, as pointed out in the issued U.S. Pat. No. 3,585,714, these layers must, at the same time, be both thick (but non-flaking) for good protection and yet thin (but non-cracking) for reduced mismatch stresses. They must also be permanently, chemically, and fairly continuously yet firmly bonded to the underlying solid-state materials and, therefore, cannot always or in all respects, be inert or neutral. These layers may, for example, be chemically active by introducing contaminants, diffusants, unwanted impurities, or chemical reactants. They may also be physically active by creating intolerable mismatch stresses and strains, microcracks, dislocations, or other physical defects in the device materials. These layers may even be electronically active by providing unwanted dopants, carrier traps, barrier regions, shorting paths, or inductively-coupled and capacitively-coupled surface streaks or films.

SUMMARY OF THE INVENTION

Therefore, to overcome the foregoing and other difficulties, the general object of this invention is to provide an improved, surface-passivated semiconductor device having very small geometries.

An object is to provide a semiconductor device with the peripheral surface of its pn junction region uniquely buried in and surrounded by discretely spaced-apart, inert material regions and not just thin (typically 4000 Å), continuous surface layers.

It is another object of the invention to provide a semiconductor device with an expanded, or differentially expanded, junction region peripheral surface similarly buried in, and surrounded by, metallurgically continuous (not added or applied on) material layers or regions.

Yet another object is to provide a semiconductor device with an enclosing isolation oxide region having a unique geometry, size, and position relative to the pn junction so as to achieve novel effects.

A further object is to form high-density, high-yield, but low-cost silicon integrated circuits with dielectrically isolated circuit components.

Still another object is to provide methods for low-cost, high-volume production of these new semiconductor devices. Various other objects and advantages, and a more complete understanding of the invention, will become apparent to those skilled in the art from the following description and claims, taken in conjunction with the accompanying drawing.

DESCRIPTION OF THE DRAWING

For the purpose of illustrating the invention, there is shown in the drawing the forms which are particularly preferred. It is understood, however, that this invention is not necessarily limited to the precise arrangements and instrumentalities here shown but, instead, may combine the same described embodiments or their equivalents in various forms.

DESCRIPTION OF THE PREFERRED EMBODIMENTS

Figure 1:
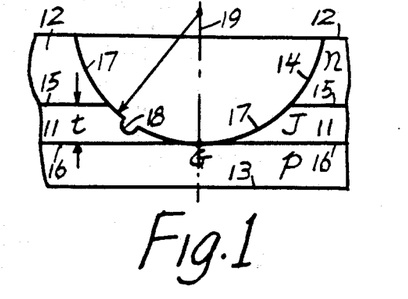
FIG. 1 is a partial cross-section of a semiconductor device having therein a curved-around, junction region peripheral surface and a gas-filled isolation groove.
Figure 2:
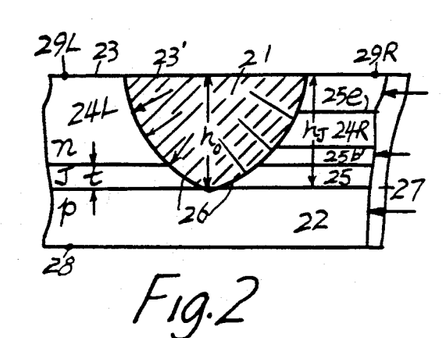
FIG. 2 shows portion of a silicon structure having a partly buried, pn junction region peripheral surface in contact with a round-bottomed, discretely in-situ formed silicon dioxide material region.
Figure 3A:
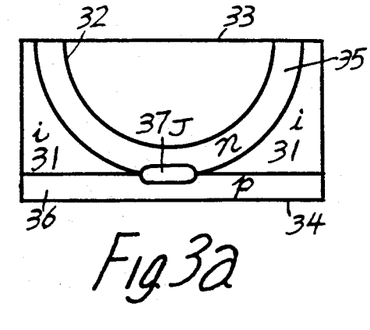
FIGS. 3(a) and 3(b) shows a semiconductor device having its pn junction region peripheral surface completely buried in an intrinsic, or electronically inert, semiconductor material.
Figure 3B:
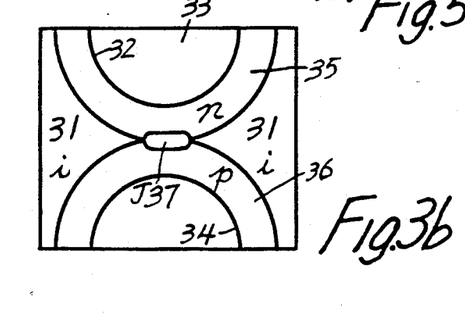

The pn junction devices of FIGS. 1-3 are sufficiently disclosed in my issued U.S. Pat. No. 3,585,714. They are being redescribed herein.

With reference to FIG. 1, there is shown a single-crystalline, device wafer comprising a pn junction (transition, or depletion) region 11 of appreciable thickness, t, formed between a p-type, monocrystalline silicon substrate 13 and an n-type doped, epitaxial silicon layer 12 grown thereon. That the junction region 11 has finite thickness is well known; see, e.g., *Transistor Engineering* by A. B. Phillips, McGraw Hill Co., N.Y., 1962, pp. 111 and 115. A cylindrical groove 14 of radius r is made into and past the junction region 11, which is defined by its upper and lower end or boundary planes, 15 and 16, respectively. The peripheral surface 17 of the junction region 11 is distinctly curved and curved-around. That is, the surface has two opposing sides each containing more than one distinct slope across the thickness direction. Notice that when the groove has a centrally curved or rounded bottom, which is symmetrical with respect to the bisecting longitudinal plane 19, such as is shown in FIG. 1, the peripheral surface expansion is infinite at the lowest point G, but decreases gradually, and equally on both sides thereof, toward the transversely-expanding, higher-level positions. For a case where r=1 cm and t=1 μm, the total or integrated surface expansion for the entire 1-μm junction region, as shown in the bottom five numbers (for positive h subm, i.e., groove bottom G below pn junction) of column 4 (r=1 cm) of the table in U.S. Pat. Nos. 3,430,109 and 3,585,714, is 141.4, 103.6, 58.58, and 30.19 if the bottom of the cylindrical groove G is located at 0, 0.1, 1.0, and 5.0 microns, respectively, below the lower end plane 16 of the pn junction 11. These large surface expansions cannot be reproduceably made by the conventional beveling technique, if at all possible. The groove 14 in FIG. 1 also contains a smaller groove 18 therein on its left side. For a smaller radius r, the surface expansion is smaller, but so is also the chip real-estate occupied by the groove or device.

As shown in U.S. Pat. Nos. 3,430,109 and 3,585,714, the bottom G of the groove 17 may be within a few microns (even one or ½ micron) below or above the lower end plane 16 of the pn junction 11. The elongated (cylindrical) groove 17 may be parallel to the same junction plane 16 and have its bottom line at G coinciding therewith. The groove 17 may be purposely tilted relative thereto so that the same groove may be above the junction plane 16 at some places, substantially coincide therewith at another place, but lie below the same plane at other places.

While a linearly or curvedly sloping surface on the device peripheral surface is useful to achieve surface expansion of the junction region, a U-shaped or V-shaped, or turn-around peripheral surface is necessary to allow high-density packing in integrated circuits. Such U-shaped or V-shaped peripheral surfaces also form the all-important gas or dielectric-isolating grooves. The geometry, size, material composition, formative condition, and position (relative to the pn junction) of these grooves are very critical and will be more fully described in this specification.

The device of FIG. 2 is made, in a way preferred according to certain criteria, by selectively thermally growing an oxide groove, band, or material region 21 of depth $h_o$ transversely into a monocrystalline p-type silicon substrate 22. This is followed by in-diffusion of n-type dopants from the top surface 23. Such a diffusion, being guided by the inner peripheral surface of the oxide region, is self-aligning. The masking step is thus non-critical. Further, the lateral area of the resultant pn junction is microscopically precisely predetermined. The result of this diffusion is the (top) doped, n-typed epitaxial silicon layer 24 and the new pn junction region 25 of thickness t and maximum depth (during service) $h_j$ that does not exceed $h_o$ for many preferred embodiments. For other applications, $h_j$ may exceed $h_o$. Also, the pn junction 25 may be formed prior to or during the oxidation step. Notice that the differentially expanded, junction region peripheral surface 26 is surrounded by the inert oxide material region 21. Further, this oxide region electronically isolates the two sides of the device. These two sides can, therefore, be used as two independent, electrically isolated but physically integral diodes. Each of the two diodes comprises a top n-type, epitaxial layer 24, a bottom p-type substrate 22 and a pn junction region 25 therebetween. This pn junction 25 thus extends both in the common substrate or buried layer 22 and the top layer 24. These diodes share the same p-type substrate, which electrically connects the silicon pockets 24L and 24R that would otherwise be electrically isolated. They are, therefore, physically integral or non-independent; but are electrically independently operable with respect to the biasing voltage applied to, and the signal translation in, the respective pn junctions 25. Thus, while the left 24L/22 diode may be forward biased, through suitable contacts such as 29L and 28, the right 24R/22 diode may be forward biased also (through contacts 29R and 28) but at a completely different voltage, may be zero-biased, or may even be reverse-biased. In this electrical sense, the two diode components of the integrated circuit devices of FIGS. 1 and 2 are isolated and independent. And this is made possible by the gas or oxide-filled groove (17 or 21) at the side thereof and the isolating pn junction (11 or 25) thereunder.

Dopant diffusion or introduction, electrical contacting, and controlled epitaxial layer growth are well known in the semiconductor art. If needed, additional pn junctions, e.g., 25b and 25e, may be formed in the device of FIG. 2 (See also FIGS. 4 and 8), and the various layers suitably connected so as to form completely isolated dodes, transistors, tetrodes, . . .

It is to be noted that the device of FIG. 2 is not a complete device, as clearly shown by the curved, cut-out lines on both the left and right sides thereof. A complete device would be similar to integrated circuit shown in FIGS. 6 and 7 (See also FIGS. 5 and 6 in the parent U.S. Pat. Nos. 3,430,109 and 3,585,714) where the gas, vacuum, or dielectrically insulating, close-ended (or annular) grooves provide a plurality of electrically isolated silicon pockets or islands for the electrically independently operable diodes, transistors, or other active or passive components such as resistors, capacitors, and inductances.

Thermally growing $SiO_2$ (silicon dioxide) substantially transversely into selected areas of a silicon substrate can be achieved by the usual masking techniques. Diffusion through masked areas is well-developed in the semiconductor industry. Thus, silicon can readily be chemically plated or vacuum deposited with layers of such metals as platinum, rhodium, gold, and nickel; or even some nonmetals such as $Si_3N_4$ or SiC. These insulation layers are oxidation-inhibiting for the silicon thereunder, but may be made even more so, if needed, by additional treatment or other oxidation-preventing surface layers electrolytically plated or otherwise built thereon. Windows may then be opened by mechanical, chemical, thermovacuum, or photoengraving means through these oxidation-inhibiting layers, for oxygen diffusion at selected areas. A very successful silicon nitride masking technique for diffusion into silicon of oxygen, boron, gallium, phosphorous, and arsenic has been given by V. Y. Doo (See "Silicon Nitride, A New Diffusion Mask," IEEE Transactions on Electron Devices, Vol. 13, No. 7, 1966, pp. 561-563) and also by J. A. Appels et al in "Local Oxidation of Silicon and Its Applications in Semiconductor Device Technology," Philips Research Reports 25, page 118, 1970. Doo, for example, shows that thin layers of $Si_3N_4$ from 150 to 1200 Å thick can be pyrolytically deposited on silicon from silane and ammonia with excess hydrogen at 750° to 1100° C. These layers have been successfully employed to mask the diffusion of B, P, As, Ga, and O, when the commonly used photoengraving techniques are used. Such techniques generally involve a KMER (Eastman Kodak) photoresist layer formed on the $Si_3N_4$ layer, to be exposed to ultraviolet light through a mask and selectively removed at "window" areas by hydrofluoric or phosphoric acids. Atoms of O, B, Ga, P, and As may then be thermally diffused into the silicon, through these windows exclusively.

Alternately, ion implantation techniques may be used to introduce oxygen and nitrogen ions to be combined with silicon atoms into inert silicon oxide or nitride material regions. Under an implanting voltage of one megavolt, oxygen and nitrogen ions can be introduced into silicon host to a depth of $1.7 \pm 0.13$ μm and $1.87 \pm 0.12$ μm, respectively.

In thermal oxidation, one mole of silicon (28.0 g or 12.0 cc) reacts with one mole of oxygen (32.0 g) to form one mole of $SiO_2$ (60.0 g or 25.9 cc), the densities of silicon and $SiO_2$ being 2.34 and 2.32, respectively. The volume ratio of $SiO_2$ to the original silicon is thus $25.9/12.0 = 2.16$. The unrestricted linear expansion for the silicon upon complete, in-situ oxidation to $SiO_2$ is thus: $3\sqrt{2.16} - 1.00 = 29.2\%$. Similarly, the in-situ formation of $Si_3N_4$ from Si also results in substantial linear expansion (about 4.3% if the density of the nitride is 3.44, as reported). The tendency of this significant, linear and volume expansion during the in-situ formation of the entire discrete, oxide (or nitride) region (not layer or coating) from silicon introduces compressive stresses parallel to the pn junction end planes 15 and 16, i.e., across the lateral dimension of the junction and oxide regions. Because the oxide region comprises at the top a free (or gas-exposed) surface and a rounded bottom (with no shart corners), and because of the inherent graded seal or graded (oxygen) concentration effects present, these high stresses are spread out more evenly over wide areas and do not cause splitting cracks. On the other hand, properly directed compressive stresses from the intentional mismatched expansion coeffients are well-known to strengthen brittle materials such as Si and $SiO_2$. The resultant device is thus resistant to relative tangential movement (i.e., rubbing contaminations) between the semiconductor silicon and $SiO_2$ at the junction peripheral surface 26, and also to crack formations by mismatch stresses during thermal cycling, such as from environmental conditions or from repeated, on-off operations of the device.

An oxide region consisting entirely of in-situ formed silicon oxide is advantageous for some other reasons. The oxide region is 100% dense, substantially chemically pure and uniform, and non-contaminating. It is also impervious to contaminating gases and mobile ions, being made more so by the residual compressive stresses. This is in sharp contrast to other procedures in which the cut or etched-out grooves in silicon layers are superficially oxidized into thin (e.g., 8000Å) $SiO_2$ layers and coatings and later filled with such materials as polycrystalline silicon, glasses, oxides, or plastics. This is because flat oxide layers on silicon, as shown below, have no curvature-related strain-relief mechanisms and are thus unreliable because of crack formations in the layer through the same mismatch stresses acting harmfully here. Also, these filling materials are almost always impure, particularly when compared to $SiO_2$ formed in situ. Schwartzman, for example, pointed out (in U.S. Pat. No. 3,383,760, Col. 4, lines 4-6) that "most glasses contain impurities that may adversely affect the pn junction". Further, the filled materials are not 100% dense, particularly with narrow grooves in microcircuits (See, e.g., Frouin patent No. 3,520,139, Col. 2, lines 44-46), and do not contribute much to the beneficial compressive mismatch stresses. In addition, both the cracked oxide layer and non-dense filled materials "breathe" and thus easily contaminate the shallowly located, peripheral surface of the pn junction region.

In contrast to in-situ formed oxide layers, the discrete or spaced-apart, specially shaped and positioned, oxide regions of this invention also lower, through curvature, proximity, and other unique effects, the mismatch stresses to smaller magnitudes or dosages that can be harmlessly assimilated in localized areas. There is thus the beneficial compressive stress pattern, but no excessive build-ups of harmful stresses that may crack, split, microfissure, or fail the device. Aside from electrical and chip real-estate considerations, there is thus a limit between the relative areas occupied by the silicon and silicon oxide regions, a maximum lateral dimension of the oxide region, and a minimum separating distances between two neighboring oxide regions. As a rule, the relative area ratios of silicon to $SiO_2$ should be between $\frac{1}{4}:1$ to 4:1; the maximum lateral dimension is about 10 times the depth of the oxide region; and the minimum separating distance is about one times the lateral dimension.

A rounded bottom lessens the splitting forces on the underneath silicon layer because the oxide (or nitride) region, particularly if favorably compresses during the oxide formation due to the silicon volume expansion, has a blunt, rather than a sharp tip or bottom (no notch effect). Also, the thermoelastic mismatch stresses between any two connecting materials in general and between silicon and its attached $SiO_2$ in particular, are always continuously or nonabruptly varying around rounded bottom (curvature effect), and also are smaller on a curved adjoining surface than on a flat adjoining surface (curvature effect on stress pattern). The same stresses are zero or minimal in the lateral direction at the bottom if it ends as a tip or line of zero width and also minimal and symmetrically distributed when the bottom is symmetrical with respect to a longitudinal bisecting plane thereof (oxide region geometry effect). It is, therefore, highly desirable to locate the pn junction at (for oriented or tilted tangency to achieve very large surface expansion), or within a few microns of (for proximity effect), the bottom of the round-bottomed oxide region.

Notice also that a properly shaped, sized, and positioned oxide or gas-filled groove, as disclosed in U.S. Pat. No. 3,585,714, systematically varies, in a predetermined manner, the transverse or cross-sectional area of the junction region, with the depth or thickness thereof, to allow the laterally extending area of the active region to be accurately defined with microscopic precision.

The junction region 11 of the device of FIG. 1 can be prepared first before the gas-filled groove 14 is formed into the doped, n-type epitaxial layer 14. The junction region 25 of the device of FIG. 2 can also be prepared prior to, or during the same formation of the oxide-filled groove 21 in the doped, n-type epitaxial layer 24. A feature of the invention, however, is to form the oxide region 21 first at a high temperature (typically 1000° to 1350° C.) followed by the junction formation. The subsequent lower-temperature junction-forming step, by, for example, dopant diffusion at 900° C., or ion implantation at even lower temperatures, relieves excessive compressive residual stresses. But some residual, beneficial compressive stresses always remain because of the temperature differences in oxidation and junction formation.

The device of FIG. 3 is made by starting with a slab of intrinsic semiconductor material 31 with a single groove 32 made into the top surface 33, such as that in FIG. 3a. The same slab may be alignedly grooved on both the top and bottom surfaces (FIG. 3b). Next, n-type and p-type dopants are diffused in, from the top and bottom surfaces, 33 and 34, respectively. The result is a top n-type layer 35, a bottom p-type epitaxial layer 36, and an intermediate, striped or pan-cake type pn junction region 37. This junction region is well inside the slab and is completely surrounded by, and buried in, the substantially electronically inert or non-active (at least during device operation) material 31. The same active or junction region can be relatively planar or curved, depending on the surface concentrations of the n-type and p-type dopants and also on the thickness of the slab.

Figure 4:
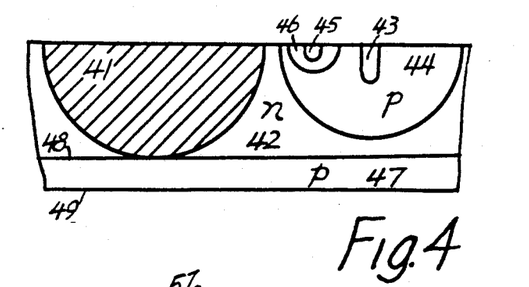
FIG. 4 shows npn transistor structure in a microcircuit made by discretely in-situ formed, oxide isolation region and three-dimensional dopant diffusion.

The device of FIG. 4 is made by forming, in a manner similar to the making of the device of FIG. 2, an oxide, nitride, or other electronically inert material region 41 in connection with the pn junction between two silicon layers 42 and 47. A hole or slot 43 is then formed so as to introduce three-dimensional, p-type dopant sources and to form the p-type base region 44. Finally, a shorter hole or slot 45 is made to form the n-type emitter region 46. This completes a new npn transistor structure which can, of course, also be made by the familiar repeated maskings and diffusions. By controllably varying the shape, size, and location of the holes, slots, or other depressions, as well as the type, surface concentration or total amount of the dopant or other foreign atoms introduced by diffusion or ion implantation through the newly-formed surfaces of these depressions, other unique diodes, transistors, tetrodes... of novel configurational designs may also be made. Oxygen and nitrogen, being also foreign atoms relative to silicon, may be thus introduced to form the required isolation inert material region or groove 41, such techniques can even be used to form the cross-under or low-resistivity regions underneath an isolation pn junction and connecting pockets of the otherwise electrically isolated silicon material that are separated by the oxide grooves or material regions 41.

The device of FIG. 4, like that of FIG. 2, is only a portion of a larger integrated circuit device containing a larger plurality of similar components than is shown. The npn transistor in FIG. 4 is completely isolated electrically from neighboring npn transistor (not shown), laterally by the oxide region 41 and underneath by the pn isolation junction 48. Even if the device is sliced off at the junction plane 48, the silicon pockets and npn transistors are still completely isolated from each other. Similarly, when the emitter-base and base-collector junctions are present, as shown by 25e and 25b respectively, the npn transitor shown is also electrically isolated from similar npn transistors on the other (e.g., left) side of the oxide region 21. Further, when the device of FIG. 4 is used as an integrated diode circuit containing n-type region 46 and p-type region 44, these diodes are also completely isolated from similar diodes on the other side of the oxide region 41, even without the use of the bottom pn junction 48. Similarly, the integrated circuit device of FIG. 2 can be used as a silicon structure of passive resistors 24L, 24R, ..., only. These resistors are then also completely electrically isolated from each other by the oxide region 21 and the pn isolation junction 25. In each of the above cases of complete electrical isolation, the individual components can be operated fully independently of each other without sharing any common semiconductor layers or electrical connectors.

Figure 5:
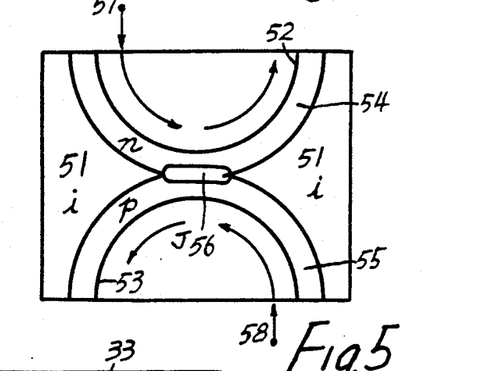
FIG. 5 shows a high-power laser device having its buried, pn junction region peripheral surface differentially expanded for improved cooling results.

The high-power laser device of FIG. 5 is made in a manner similar to the making of the device of FIG. 3b. Here, two grooves 52 and 53 are cut into an intrinsic material slab 51. Dopant diffusions are then carried out to form the n-type top region 54 and p-type bottom region 55. These two regions are separated by the buried pn junction region 56. Rapidly moving cooling fluid jets or streams 57 and 58 (such as of air, water, or brine) are introduced tangentially to the grooves, as shown. The high velocities and centrifugal forces of the jets or streams insure good thermal contact of the cooling fluid and guarantee efficient surface cooling. In this device, the light beams travel in directions normal to the figure, being bounded by two optically flat surfaces (not shown) parallel to the drawing paper. One of these two surfaces allows the laser beam to come, e.g., out of the paper. Alternately, the intrinsic material region 51 may be replaced by thermally grown-in silicon dioxide on a silicon substrate. It is to be particularly noted that the active regions of the devices of FIGS. 3 and 5 are isolated from the ambient-exposed surfaces of the device, where degradation is likely to proceed at the fastest rate. Further, for the same current density, the total current—and thus power input to the device—is much smaller, and the solid regions 31 on either side of the stripe active region are able to carry heat away from the current-carrying active region.

Figure 6:
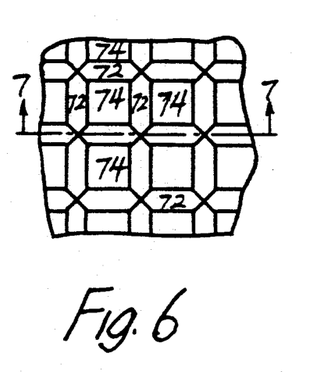
FIG. 6 is a top view of a monolithic microcircuit containing a system of normally intersecting, gas or oxide-filled grooves.
Figure 7:
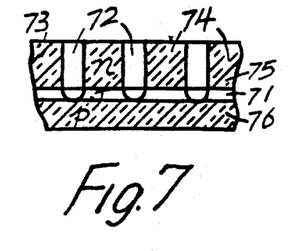
FIG. 7 is a cross-section of the device of FIG. 6, taken along the line 7—7.
Figure 8:
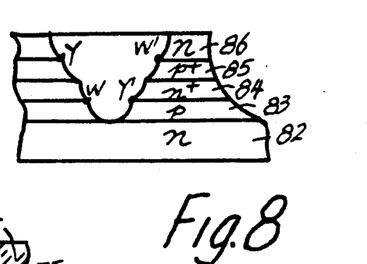
FIG. 8 is a cross-section of a "universal integrated circuit" showing the unique circuit structure.

FIGS. 6–8 have been described in my U.S. Pat. Nos. 3,430,109 and 3,585,714. FIG. 6 shows a top view of a piece of a monolithic microcircuitry chip broken off from a 6 cm.×6 cm. semiconductor wafer containing thousands of individual, isolated or discrete units of circuit elements. Notice that there are two groups of linear and mutually perpendicular, gas or oxide-filled grooves 72. FIG. 7 shows a vertical cross-section of the same microcircuitry piece taken along line 7—7 of FIG. 6. In this cross-section, the grooves are seen to originate from the top surface 73 and to have cylindrical bottoms with the bottom lines lying in the lower (end or boundary) plane 76 of the junction region 71 thereby achieving maximum surface expansion. Each of the isolated or discrete circuit elements located in the individual silicon pockets 74 may be made to operate independently of, or in a completely isolated manner relative to, the others in a special signal translation operation therein, with a performance improved by the unique shape, size, and position of the grooves.

FIG. 8 shows a portion of an integrated circuit which is "universal" because it may be designed to contain innumerable combinations of electrically isolated, active and passive circuit components, such as diodes, triodes, tetrodes, ..., resistors, capacitors, and the like. Yet the circuit has only five carefully chosen and physically integral, semiconducting material layers from which all these individual components are made. These layers are one on top of the other, alternately p and n in electronic conductivity type, i.e., n, $p^+$, $n^+$, p, and n form the top down. A substrate may be used here containing the bottom one to four layers with the remaining top layers epitaxially deposited thereon. From these layers and the gas or oxide filled groove YWY'W', many active components may be formed including: four pairs of diodes, three pairs of triodes or transistors, two pairs of tetrodes, and a single pair of pentodes. From suitably connected regions in these same coating semiconductor layers, many precision resistors, capacitors, electrically conductive paths, and other passive components can be also made. The dimension and operating characteristics of these components are accurately defined laterally by the enclosing, microscopically precise oxide grooves and transversely by the electrically rectifying pn junctions. In particular, low resistivity layers may form cross-overs, cross-unders, buried collector layers, ..., to be suitably connected by diffusion or metal films, as per conventional semiconductor technology. Note that the groove YWY'W' comprises several subgrooves (such as at Y, W, Y', and W'). The bottom of the main groove YWY'W' is within a few microns of most of these layers or pn junctions, while the bottoms of most of these subgrooves are within a few microns above some pn junctions but below others.

The manufacture of these microcircuits containing both active components and passive components may involve single or repeated sequences of such selected processing steps as forming nitride insulating layer; masking and selective nitride (or oxide) removal; etching, grinding or energetic beam bombarding to form microscopically precise depressions into these exposed areas; thermal oxidation (or dopant diffusion) into these depressions; masking and selective oxide removal; removal of residual nitride or oxide layer after oxygen or dopant diffusion; forming low-resistivity cross-over or cross-under regions similar to Doo's $p^+$-type region 4 in the p substrate (see U.S. Pat. No. 3,386,865); dopant diffusion or ion implantation through oxide windows for pn junction formation or electrical contacting to the low-resistivity, buried cross-overs or cross-unders; and electrical contacting through windows in oxide layers covering the device surfaces.

The second and third (from top down) semiconductor layers have superscripts to indicate very heavily doped, p-type and n-type materials, respectively. These superscripts may be replaced by "−" signs in some cases to indicate very lightly doped materials. Two more useful combinations of semiconducting layers thus obtain: $np^-n^-pn$ and $npn^-p^-n$. In these later combinations, we have (relatively) low-resistivity, n and p-type layers, (or $n^+$ and $P^+$-type) layers, 82 and 83, respectively, lying underneath the (relatively) high-resistivity $n^-$ and $p^-$ resistivity layers, 84 and 85, respectively. These low-resistivity layers may occupy regions in the substrate directly beneath the lowest pn junction to form buried cross-unders connecting isolated silicon pockets electrically.

It can be seen that oxide-isolated, monolithic solid-state circuitries having densely-packed, electronically discrete units of solid-state components can be made, according to this invention, by means of intersecting and triangular, square, or, in general, polygonal or close-ended (or annular), isolation oxide grooves in any possible top widths or configurations and cross-sectional shapes but completely and accurately defining the lateral limits of the active regions or isolated silicon pockets, regions, or islands. These close-ended grooves are to be referred to as "annular (—shaped) isolation regions." To minimize physical damage during mechanical grooving, to facilitate microscopically precise chemical etching or cutting, to maximize device yield, or to obtain other special optoelectrical effects, the directions of the grooves may be made to coincide with crystallographic directions of extreme or maximum atomic density, e.g., <111> directions on (111) wafer of single-crystalline silicon or germanium. On (100) single-crystalline materials of silicon or germanium, the <100> directions are preferred for similar reasons. A suitable system of grooves, formed on a device wafer containing even a single or several pn junction regions, may yield many discrete, electrically independently operable, active or passive circuit components.

By preparing a groove, slot, hole, or other depression into the semiconductor layer and applying or introducing the right amount of dopants or foreign atoms (such as O, N, Ga, B, P, As) at selected, unmasked locations in the resultant depression, interval point, line, surface, or massive types of three-dimensional sources of foreign atoms are then obtained, according to my U.S. Pat. No. 3,585,714. This achieves three-dimensional configuration and/or concentration profile control of the diffusing atoms. Instead of diffusion, ion or proton implantation, or other similar foreign atom introduction techniques, can also be used in conjunction with these special depressions to achieve similar results. Skilled persons can use any one of these techniques not only to prepare the emitter, base, and collector regions of transistors (see FIG. 4); but also to form regions of differing conductivity type in the oxide-isolated silicon pockets 24L and 24R; to prepare the conventional, low-resistivity cross-unders or cross-overs located in the surface of the substrate 22 directly beneath the epitaxial layer 24 so as to interconnect regions 24L and 24R separated by the oxide isolation regions 21; to convert entire oxide-isolated silicon pockets into other low resistivity regions by dopant diffusion so as to connect from the device surface such cross-unders or cross-overs; and the like.

This technique of three-dimensional, configuration or diffusional front control can be combined with the nitride shielding method disclosed above. Take, for example, the integrated circuit device of FIG. 2. Here, a uniform, oxidation inhibiting (or insulating) silicon nitride layer is first laid on the top surface 23 of an n-type silicon layer 24 epitaxially grown on top of a p-type substrate 22. Windows are then opened up in this nitride layer, e.g., by HF etching, without affecting (much of) the underlying silicon. Specifically, portions of the nitride insulation is removed or unmasked overlying the regions of the epitaxial silicon layer to be converted into the oxidized isolation regions. Grooves, holes, or other depressions are then made in the window areas by mechanical grinding, chemical etching (e.g., with HF-HNO$_3$), or energetic particles bombardment without affecting the remaining nitride layers. These depressions are made to a microscopic accuracy in terms of the depression shape, size, depth, and lateral location in the epitaxial silicon layer exposed by the removal of the nitride layer. But "microscopic" I refer in this application to dimensions, accuracies, precisions, . . . of less than a few microns. The silicon wafer is then (oxygen implanted or) thermally oxidized, through the newly exposed surface of the depression to form the oxidized silicon isolation region 21 extending through the epitaxial layer 24 to the isolation pn junction 25. This procedure subdivides the epitaxial silicon layer 24 into a plurality of oxide-enclosed and electrically isolated, pockets of semiconductor silicon material. Any residual nitride layers can easily be removed after their uses by HF or H$_3$PO$_4$. In addition, this procedure provides microscopically accurate control of the shape, size, and location of the resultant annular, or close-ended, oxide grooves thereby achieving similar controls of the critical depth of these grooves, of the lateral dimension (and pn junction area) of the isolated silicon pockets, of the exact shape of the diffusional front, of the planarity of the top surface 23' of the oxide grooves, and of the coplanarity of the top oxide surface 23' relative to the silicon layer surface 23.

The device of FIG. 2 contains only a simple, pn junction to exemplify the optoelectromagnetic, signal-translating active region. Other devices may have much more complicated structures. Specifically, the top and/or bottom layers 24 and 22 of FIG. 2 may be replaced by, for example, up to five layers of the device in FIG. 8, and contain not only p and n layers but also p$^+$, n$^+$, i$_p$ (very weakly p-type intrinsic), and i$_n$ (very weakly n-type intrinsic) materials. The p or n materials are widely (by at least several orders of magnitude) different in electrical conductivity and dopant concentrations relative to p$^+$ and i$_p$ or n$^+$ and i$_n$, respectively. These layers may be prepared either before, during, or after the gas or oxide-filled grooves are formed, as per conventional semiconductor technology.

Note that the thermally grown-in oxide, ion-implanted oxide or nitride, or the intrinsic material regions of the devices of FIGS. 1-5 are not only substantially electronically inert but also unetched, uncut, and otherwise similarly unmodified. This condition preserves the as-formed, metallurgical continuity in the lateral directions. Metallurgical continuity reduces or minimizes mismatch stresses through the graded-seal effects, because the inherent compositional changes and mismatched stresses are now changing gradually and not abruptly. These material regions are thus completely different in structure, mode of operation, and result from the usual, painted-on organics or fired-on glasses. Even the common oxide or nitride surface layers are too thin and too imperfect, and also improperly oriented and positioned relative to the pn junction region, to achieve the results of this invention. Specifically, the conventional, relatively thin and planar, oxide surface layers for device junction passivation is, for example, very thin (generally only several thousand Angstroms thick, typically 4000 Å). As mentioned above, too thin a layer tends to crack and gives inadequate protection, while too thick a layer often peels or flakes off and causes excessive mismatch shear stresses at the oxide-silicon interfaces. These high harmful stresses arise from several reasons. Firstly, SiO$_2$ expands, i.e., has a temperature coefficient of thermal expansion of, about $5.0 \times 10^{-7}$/°C. while silicon expands about ten times as much. Secondly, the oxidation step is usually done at high temperatures (up to 1350° C.) in an oxidizing ambient (e.g., steam), so as to allow great build-up of the mismatch stresses during the wide cooling temperature range. Thirdly, the normal stresses at the free (i.e., gas or vacuum exposed) surface of oxide must be zero. There is, therefore, a very steep normal stress gradient across the very thin surface layer. Fourthly, the geometry of the thin surface layer (see layer 27 in FIG. 2) allows no stress relief, particularly when the layer is flat. These conditions generally result in pinholes, microcracks, faults, . . . , and imperfect oxide protection. Further, any oxide defect will immediately expose the underneath silicon to the ambient, again because of the thinness of the surface oxide layer.

Contrarily, in the grown-in oxide region 21 of FIG. 2, the oxidation step is, for some application, preferably done first when there is no junction region 25 to damage by mismatch stresses. The lower temperature (about 950° C. or below) junction forming step actually acts as beneficial, annealing and stress-reliefing operation. The depth h$_j$ of diffused junction regions usually must exceed one or two microns for reliability, and often are much greater for collector-base junction regions. A large depth h$_j$ requires deep oxide penetration h$_o$ (which in many cases must be no less than h$_j$) and, usually relatively large width across the oxide free surface (FIG. 2). This means that the oxide region is less easily damaged by cracks, pinholes, and faults. Even if the oxide is so damaged, the deep, contacting junction peripheral surface 26 may still not be affected. Also, there is no free or physically exposed surface in the oxide material region 21, except at the top surface 23 which is not as extensive as the oxide surface layer 27. Specifically, the top, free surface 23 is substantially less than 50% (e.g., no more than 40%) of the total surface of the oxide region 21, in contrast to the thin oxide layer 27 in FIG. 2. In this thin layer form, the free surface is substantially equal to 50% of the total surface of the layer. The free surface of the oxide region is also far away from the deeply buried junction region 25, thereby minimizing the effect of ambient on the deeply located (over two or three microns below surface 23) junction 25 through any surface-related defects in the oxide. The oxide groove 21 also terminates at its bottom in the form of a line of practically zero (not large) horizontal width. The horizontal stresses resulting from the mismatches between the oxide and silicon at this bottom, being proportional to the width, must, therefore, be zero or minimal. The same oxide groove, because of its cylindrical bottom and planar symmetry, is subjected to further reduced mismatched stresses, because of the curvature-related strain reliefs and symmetry effects. The microscopically nearby junction region is, therefore, also much less severely stressed than higher points on the oxide-silicon interface. In addition, the generally sloping and/or curved or multiply sloped sides contacting the peripheral surface 26, and/or the close proximity (within microns) of the rounded bottom of the oxide region or groove 21 to the pn junction region 25, allow some additional stress and strain reliefs.

When very severely stressed, a solid oxide region (or even thin layer) in a turn-around V or U-shaped groove may locally separate from the silicon host at the lowest point, but without cracking or excessive loss of device passivation, if the sensitive pn junction is microscopically close to the exact bottom of the groove. When such a groove has a rounded bottom, a new effect occurs, i.e., inverted arch effect. Solid oxide regions or even thin layers in the rounded bottom has an arch structure that can stand much greater forces (without failure) than if the regions or layers are flat. These results further show the critical importance of proper geometry and location of the isolation oxide material.

It is well known that a flat, thin layer on any mismatched substrate is likely to crack when extended in dimension. Familiar remedies are intentional gaps or artificial cracks in railroad tracks or concrete highways. But gaps in passivating layers on semiconductor devices are contaminating and totally intolerable. Also, once a thin layer is cracked or microfissued, no amount of etching, cutting, grinding, or filling will restore its integrity and imperviousness. Its passivating qualities are thus forever lost or greatly reduced.

The present invention solves this mismatch problem by several novel means. The oxide is purposely broken up, during its formation period, into small patches so that the mismatch stresses, being proportional to the linear dimension, are relatively small and tolerable. The isolated silicon pockets can thus be considered as gaps in an otherwise continuous oxide structure. Other solutions of the problems such as by proper oxide geometry, location, orientation, formative conditions, . . . , have already been described elsewhere in this specification.

Notice that in the formation of the conventional thin oxide layers, the oxygen atoms diffuse uniformly over the layered portions of the exposed silicon surface, essentially in single direction (see arrows across layer 27 in FIG. 2) normally of the same layer. This direction is nearly perpendicular to the laterally extending, pn junction region. The resultant mismatch stresses develop great harmful shear stresses in the transverse direction to increase the chances of shearing and contaminating damage to the pn junction. There is also a (nearly) transversely oriented free surface (with zero normal stresses thereat) with which no great lateral, normal, or compressive stresses can develop (if excessive normal stress gradient and cracking are to be avoided) to counteract such shears by friction. On the other hand, in my oxide region formation, the oxygen atoms generally diffuse through windows in the $Si_3N_4$ layer, transversely downward as well as sidewise (i.e., multi-directional as shown by arrows in the oxide region 21 of FIG. 2). The oxidation thus proceeds laterally outward in both directions from a transversely extending, moving solid core (with no free surface to dissipate stresses), thereby allowing the benefical build-up of high compressive stresses in the lateral directions across the silicon pockets and pn junctions. Such laterally directed compressive stresses minimize shear and contamination, particularly to a nearby pn junction, and are an important feature of my properly designed, isolation oxide regions. Yet this unique oxidation and compressive stress build-up need not take place extensively, if its effect can be felt at the critical peripheral junction surface located microscopically nearby. Even a thin oxide layer (e.g., 0.8 microns at the bottom of a symmetrical, 20° V-shaped groove (in which the oxide height measures $0.8/\sin 10° = 4.6$ microns) can, therefore, achieve this effect to a great degree. It is necessary, however, that the pn junction is critically located, such as within one or two microns above the groove bottom; and also that the oxide so formed is unetched, uncut, or otherwise similarly undisturbed and unmodified.

Thus, while the thin surface oxide layer 27 of FIG. 2 has the improper geometry, position, orientation, and formative conditions to allow adequate stress and strain relief on the peripheral surface of the pn junction region; the properly formed, shaped, sized, positioned, and oriented oxide region 21 of the same figure achieves improved stressing and straining patterns including beneficial compressive stress build-up on the same peripheral surface, thereby improving device surface passivation and stabilization. Hence, the transversely extending, oxide region 21 completely differs from the thin surface layer of even the same metallurgically continuous, oxide or nitride coatings normally used for some surface protection. However, even thin oxide layers can build up useful compressive stresses if they are wedged or arched in unetched form at the exact bottom of a V or U-shaped groove. Such wedging and arching actions also prevents cracking, flaking, falling out of the oxide and allow greater freedom in device passivation designs. Note that wedging actions occur at the bottom tip of both V and U-shaped grooves.

The invention, as described above, is not to be construed as limited to the particular forms disclosed herein, since these are to be regarded as illustrative rather than restrictive. For example, Ge, GaAs, GaP, InSb, and other III-V or II-VI compounds, together with inert isolation grooves of suitable materials therefor, may be used instead of Si. Further, various combinations, equivalent substitutions, or other modifications of the preferred embodiments described herein are obviously possible in light of the description, without departing from the spirit of the invention. Accordingly, the invention is to be limited only as indicated by the scope of the appended claims.

I claim:

1. A method of making a solid state integrated circuit structure of multiple solid-state devices selected from the group consisting of active and passive solid-state devices, each device having an optoelectromagnetically active region which is in or adjacent the device and is selected from the group consisting of PN junction, metal-semiconductor barrier, metal-oxide barrier, semiconductor-oxide barrier, and interfacial rectifying barrier, comprising:

ion-implanting a foreign substance which forms with the solid-state device material a dielectric material compound, said ion-implanting forming a dielectrically isolating groove which extends down into the structure and intersects an active region at least at one lateral side of the bottom of the groove;

spacing the bottom of the groove vertically within a micron of where the groove intersects said active region; and spacing the center of the groove laterally within one micron of where the groove intersects said active regions;

wherein said groove continuously curves at least where the groove intersects said active region and the radius of curvature of the groove is less than 1 cm where the groove intersects said active region.

2. A method as in claim 1 wherein the solid-state device material is semiconductor silicon and said ion-implanting step comprises ion-implanting an element selected from the group consisting of oxygen and nitrogen.

3. A method as in claim 1 wherein said compound formation during the ion implantation step creates a beneficial residual compressive stress in the solid-state device material at the places where the groove intersects said active region.

4. A method as in claim 1 wherein said foreign substance comprises nitrogen.

* * * * *

UNITED STATES PATENT AND TRADEMARK OFFICE
CERTIFICATE OF CORRECTION

PATENT NO. : 5,082,793
DATED : January 21, 1992
INVENTOR(S) : Chou H. Li

It is certified that error appears in the above-identified patent and that said Letters Patent is hereby corrected as shown below:

On the title page, under Item "[63] Related U.S. Application Data":

Line 2, after "No. 4,946,800," insert --and a continuation-in-part of Ser. No. 838,758, Oct. 3, 1977, Pat. No. 4,916,513, each of--.

In Column 1:

Line 9, after "4,946,800" insert --, and a continuation-in-part of pending prior application Ser. No. 838,758 filed Oct. 3, 1977, now U.S. Pat. No. 4,916,513, each of--.

Signed and Sealed this

Seventeenth Day of March, 1998

Attest:

BRUCE LEHMAN

*Attesting Officer*     *Commissioner of Patents and Trademarks*